United States Patent [19]

Kennon et al.

[11] Patent Number: 4,812,114
[45] Date of Patent: Mar. 14, 1989

[54] NEW IC MOLDING PROCESS

[75] Inventors: James A. Kennon, Dennison; Shafidul Islam, Plano, both of Tex.; Jeffrey L. Popken, Cincinatti, Ohio; Jerry B. Medders, Van Alstyne; Susan S. Fitzgerald, Fort Worth, both of Tex.; Donald R. Kelley, Sherman, Tex.; Philip A. Burr, Aguascalientes, Mexico

[73] Assignee: Texas Instruments Incorporated, Dallas, Tex.

[21] Appl. No.: 103,555

[22] Filed: Sep. 30, 1987

[51] Int. Cl.⁴ .............................................. B29C 45/18
[52] U.S. Cl. .................................. 425/116; 425/126.1; 425/127; 425/129.1; 425/258; 425/544
[58] Field of Search ...................... 425/116, 117, 126.1, 425/127, 129.1, 190, 544, 556, 562, 567, 572, 574, 580, 581, 585, 256, 258; 249/83, 160, 161

[56] References Cited

U.S. PATENT DOCUMENTS

| | | | |
|---|---|---|---|
| 3,973,888 | 8/1976 | Hehl | 425/129.1 |
| 4,402,657 | 9/1983 | Laghi | 425/190 |
| 4,752,198 | 6/1988 | Boschman | 425/116 |

Primary Examiner—Willard Hoag
Attorney, Agent, or Firm—Frederick J. Telecky, Jr.; James T. Comfort; Melvin Sharp

[57] ABSTRACT

A molding system and process is disclosed to interface with existing wire bonders using a single track design from the bonder through the molding process. During the molding operation, the bonded lead frame is transferred into the mold on a guide track system built into the mold chase. The mold closes and clamps the lead frame after which a compound charging system meters and injects a compound into the mold cavities. The mold is opened and the strip ejected and transferred out of the mold via internal guide tracks. A granular or pellet form of compound is use in the charging system.

13 Claims, 8 Drawing Sheets

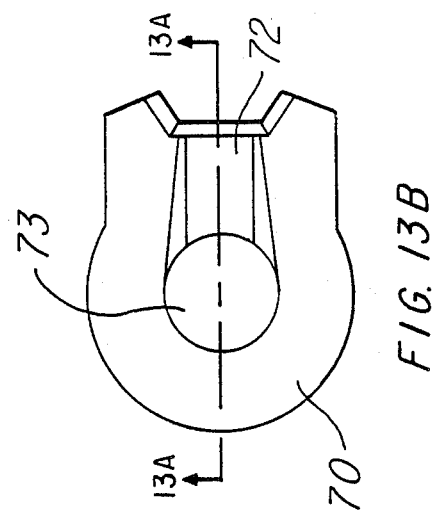
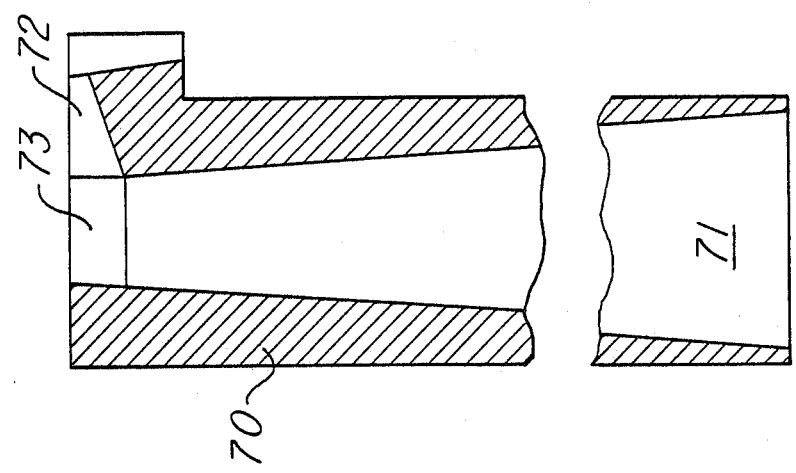

NEW IC MOLDING PROCESS

FIELD OF THE INVENTION

This invention relates to integrated semiconductor circuits and more particularly to a new process and system for encapsulating such integrated circuits.

PRIOR ART

Present day techniques for manufacturing integrated circuits include the gold-wire bonding of the integrated circuits on a lead frame at a bonding machine and then load the lead frame mounted integrated circuits into strip carriers and batch load them into a molding machine. Such handling is detrimental to the quality of the bonded integrated circuits as a large percentage of wire-bond failures are due to the integrated circuits being damaged during handling.

After molding, the molded units are then removed from the mold and sprues are removed, requiring an additional handling step.

BRIEF SUMMARY OF THE INVENTION

The present invention is a system and method of molding integrated circuits in a continuous process from the gold wire bonding of the integrated circuit on a lead frame to the encapsulation of the integrated circuit. The lead frame of the integrated circuit is transferred via a track from the gold wire bonding machine and is transferred to an internal lead frame track which is an integral part of the upper mold chase.

The lower mold chase is hydraulically activated to inset the lower mold chase with the upper mold chase. The lead frame is indexed and clamped into place by the mold chases. Indexing pins in the mold chase locate the lead frame precisely in the mold and ejector pins, which are internal to the mold chases, eject the molded integrated circuit from the mold.

Multiple charge transfer molding is used with a relatively short runner system providing better density control of the molded part. A standard granulation molding compound is used resulting in a substantial cost saving and a reduction of the preheat time as compared to molding with preforms. The mold compound metering system has a water cooled charge bar for minimum heat transfer to the compound prior to molding.

The system includes a taper-lock between the mold transfer bar and the charge bar assembly to facilitate removal from the mold area for the charging operation. The transfer bar may be quickly changed to accommodate different charge volumes. Vertical sprues the molding compound directly into cavity gates leaving no runners to remove from the surface of the lead frames.

A two-part mold chase has replaceable gate insets which may be replaced to improve the producibility for the highest wear portions of the mold. The temperature and atmosphere features are incorporated in the compound storage unit. The storage unit is a direct feed, and feeds in response to a powder probe sensor unit inside the hopper.

In operation, the mold is first in an open position and compound plungers are in a retracted position. The lead frame track in the upper chase is ready to receive a lead frame. A lead frame exits the bonder and is picked up by a mold on-load track and indexed into the center of the mold. The empty charge bar is removed from the mold and is aligned with the compound transfer bar. Both the compound transfer bar and charge bar are off center from the supply bar in order to close off the feed lines from the material hopper.

The transfer bar is moved into line with the compound storage unit supply to allow compound to fill the transfer chamber. The transfer bar is moved into line with the charge bar, thus filling the charge bar while closing off the flow of material from the supply bar.

Clamping pressure is then applied hydraulically to close the mold press which simultaneously withdraws ejector pins and pushes the internal track into the lower chase. Transfer pressure is applied to engage the tips of the charge bar. As the transfer pressure is increased, the compound is plasticized and forced into the runner system and the mold cavities.

The charge bar is heated independently of the mold chase. The charge is maintained at less than 8 grams and the cross section of the injected compound is reduced three times during the injection operation to allow a thorough mix and plasticizing of the compound before it enters through the gate into the mold cavity. The temperature at the lead frame on the top-plate has a temperature about 20-30 degrees C. lower than the runners underneath, whereby two-tone or presoldered/tinned lead frames can be processed and the solder/tinning operation can be eliminated during assembly.

After molding is complete, clamping is released and the injection plungers are withdrawn. The mold is opened, releasing spring-loaded ejector plates. At this point the internal lead frame track lowers from the upper chase with the ejected lead frame. The molded lead frame is then removed from the mold area to an off load track.

The mold is then automatically cleaned by a roller-brush/vacuum system and another lead frame is load for molding.

The present invention greatly improves the quality of the encapsulated devices and the cost thereof. The technical advance represented by the invention as well as other objects and advantages will be apparent from the following description of an example of the invention, when considered in conjunction with the accompanying drawings, and the novel features set forth in the claims.

DESCRIPTION OF THE DRAWINGS

FIGS. 13a and 13b illustrates a replaceable mold gate;

DESCRIPTION OF A PREFERRED EMBODIMENT

Figure 1:
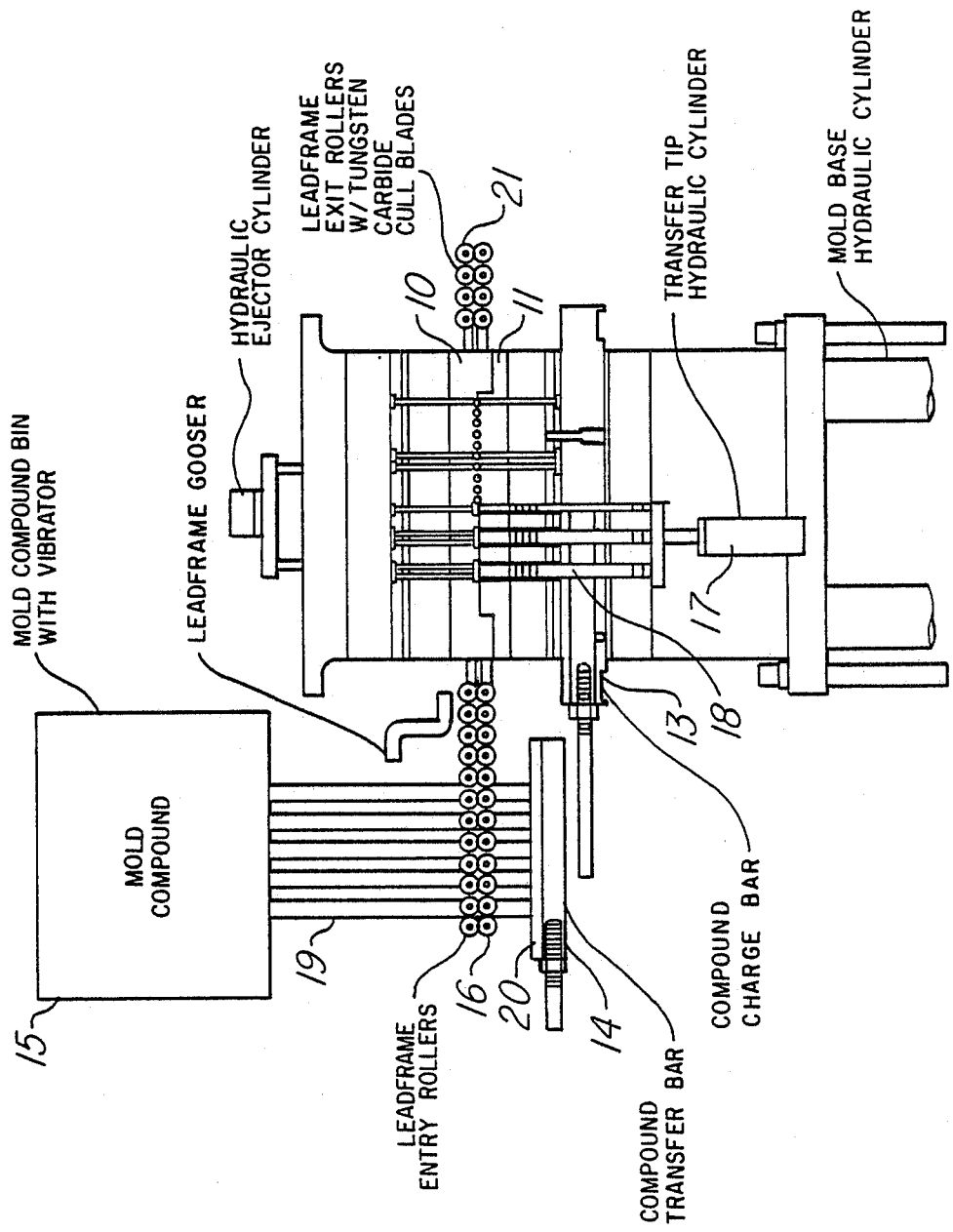
FIG. 1 is a pictorial representation of a mold machine utilizing the present invention.

An example of the present invention is illustrated in FIG. 1. Illustrated is a molding system for receiving a lead frame with a semiconductor device mounted on the lead frame and the semiconductor device having the appropriate areas of the semiconductor device connected to the lead frame terminals by connecting wires. The mold comprising upper and lower chases 10 and 11 are in an open position, and compound plungers 18 are in a retracted position. The lead frame track in the lower 11 chase is ready to receive a lead frame. A lead frame exits the bonder and is picked up by an on load track 16, and is indexed into the center of the mold.

The empty charge bar 13 is removed from the mold and is aligned with the compound transfer bar 14. Both the compound transfer bar 14 and charge bar 13 are off-center from the supply bar 20 in order to close off the feed lines 19 from the material hopper 15.

The transfer bar 14 is moved back into line with the supply to allow compound to fill the transfer chamber. The transfer bar 14 is moved back into line with the charge bar 13, thus filling the charge bar 13 while closing off the flow of material from the supply bar 20.

Clamping pressure is then applied hydraulically to close the mold press which simultaneously withdraws ejector pins 84 (FIG. 14) and pushes the internal track (described below) into the lower chase. Transfer pressure is applied by the transfer hydraulic cylinder 17 to engage the tips of the charge bar. As the transfer pressure is increased, the compound is plasticized and forced into the runner system and the mold cavities.

After molding is complete, clamping is released and the injection plungers 18 are withdrawn. The mold is opened, releasing a spring-loaded ejector mechanism (81,86), forcing the molded device from the mold. At this point the internal lead frame track 86 (FIG. 14) rises from the lower chase 11 with the ejected lead frame. The molded lead frame is then removed from the mold area to an off load track 21.

Figure 2:
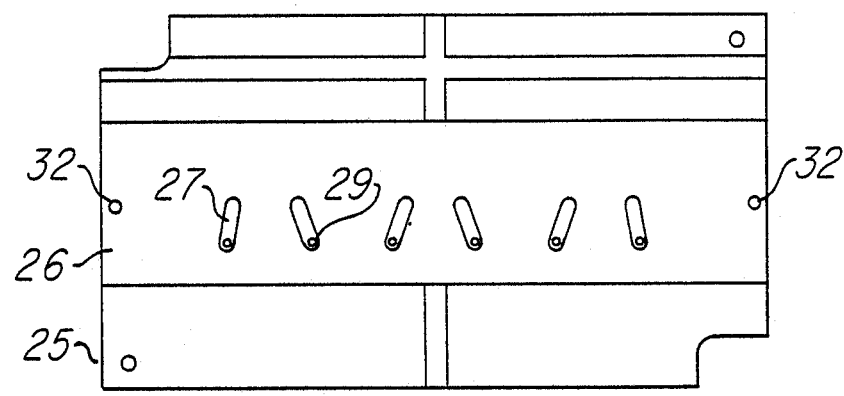
FIGS. 2, 3 and 4 illustrate the bottom, top and a cross sectional view of the bottom mold chase of the present invention.
Figures 3, 4:
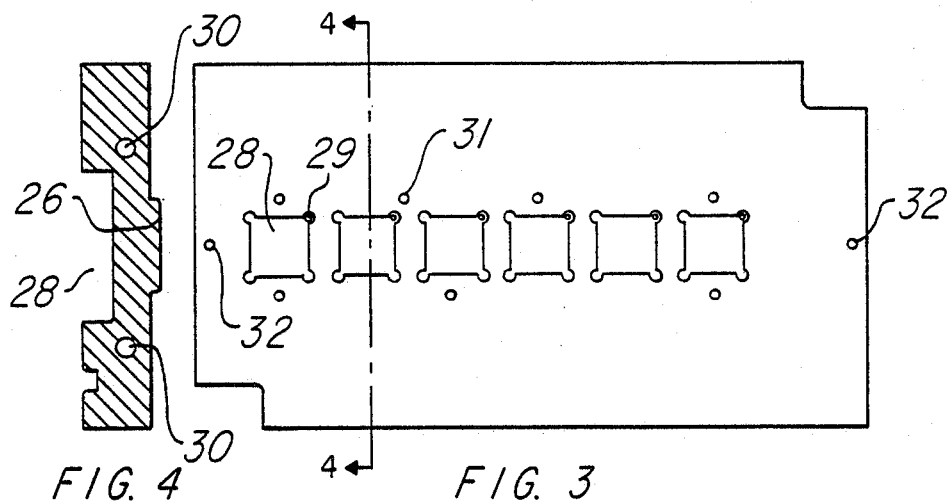

FIGS. 2, 3 and 4 illustrate the bottom mold chase. FIG. 2 is a bottom view of the lower mold chase 25. The chase has a raised region 26 that has runner cavities 27 and gates 29 for passing the mold compound into the mold cavities 28 (FIG. 3). The gate regions are at one corner of the mold cavity. Vertical sprues feed the molding compound directly into the cavity gates leaving no runners to remove from the surface of the lead frames.

Multiple charge transfer with relative short runners is used, one runner and gate for each cavity. This provides better density control of the molding compound. Pins 31 are used to align the lead frame and center the semiconductor device within the mold cavity. The lower chase has two temperature controlled heaters that extend the length of the chase and are located in the openings 30 in the ends of the chase. Openings 32 hold pins for aligning the upper and lower chases.

Figure 5:
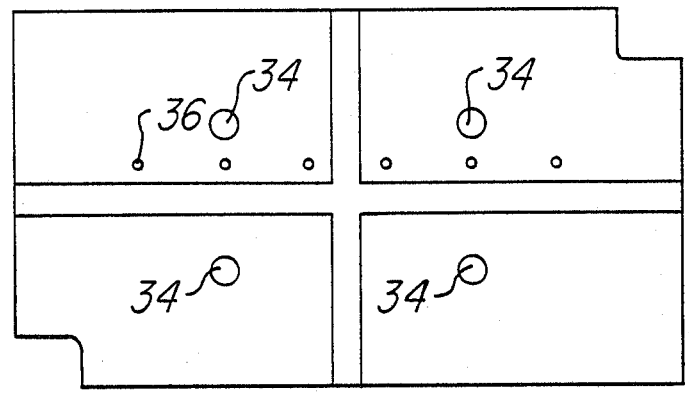
FIGS. 5, 6 and 7 illustrate the top, bottom, and an end view of the top mold chase of the present invention.
Figures 6, 7:
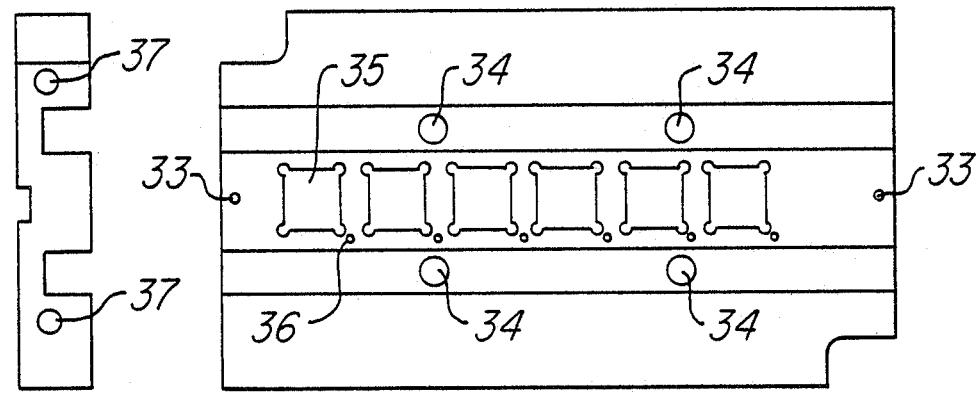

The upper mold chase is illustrated in FIGS. 5, 6 and 7. FIG. 5 is the upper side of the chase and FIG. 6 is the lower or cavity side of the chase. The cavity openings 35 match the cavity openings in the lower chase, FIG. 3. End view of the upper chase, FIG. 7, illustrates the openings 37 into which are placed temperature controlled heaters to heat the chase to the desired temperature.

Openings 34 are for the spring loaded track pins, and openings 36 received the lead frame alignment pins from the lower chase. Openings 33 received the chase alignment pins 32a from the lower chase.

Figures 8, 9:
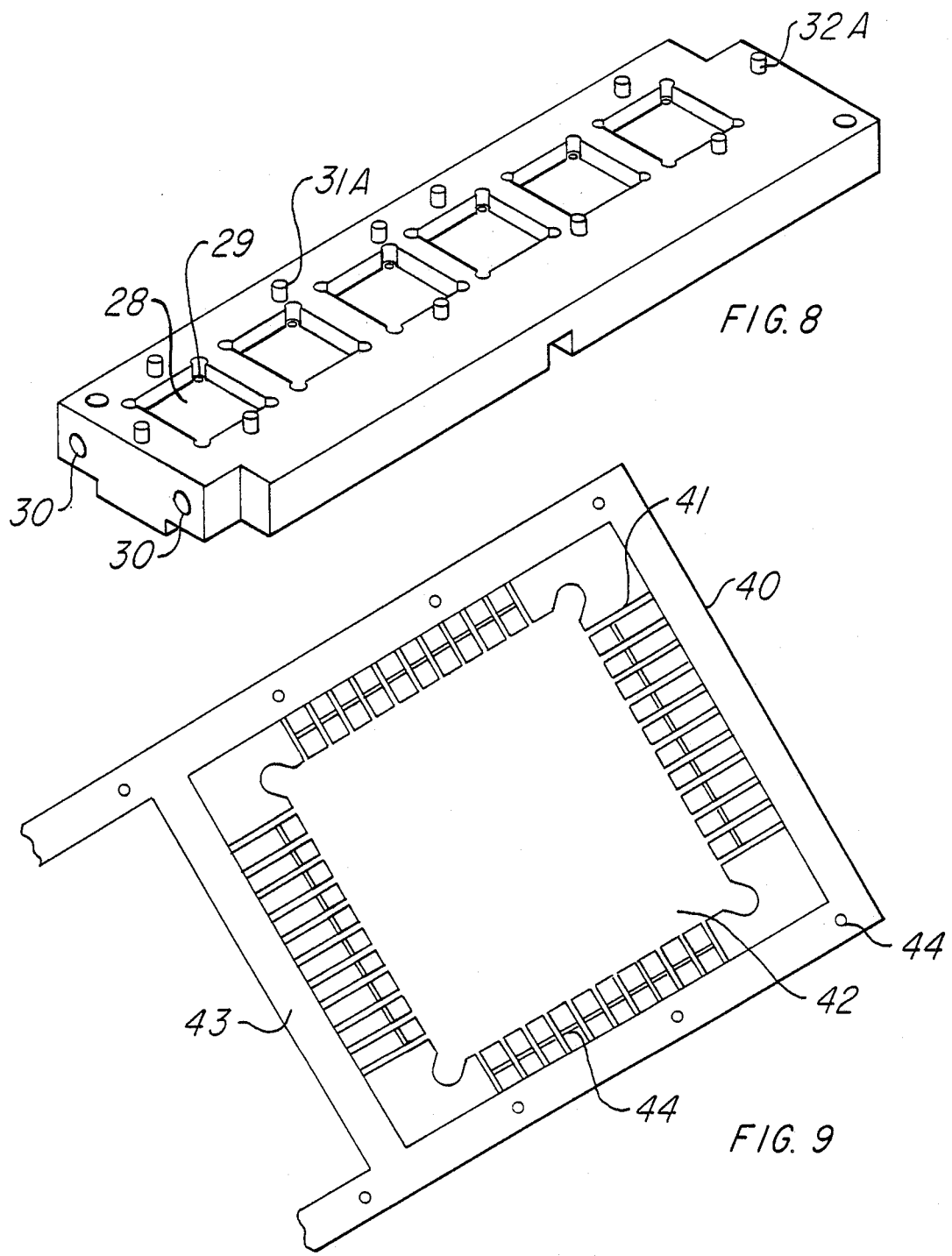
FIG. 8 is a pictorial representation of the bottom mold chase.
FIG. 9 illustrates a device in a lead frame encapsulated by the present invention.

FIG. 8 is a pictorial view of the lower chase. Illustrated is a chase with six mold cavities 28. The number of cavities is by choice and is not significant in regard to the operation of the invention. Gates 29 are shown in the corner of each cavity. Pins 31a are for track alignment and pins 32a align the upper and lower chases.

FIG. 9 illustrates an example of a lead frame and a molded device. Lead frame 40 has cross members 43 dividing the lead frame into each header section. Device leads 41 are, at this point, still connected to the lead frame and are connected by members 44 used to strengthen and brace the leads 41 during manufacture, but are removed from the completed device. The encapsulated device 42 is held in the lead frame by leads 41.

Figure 10:
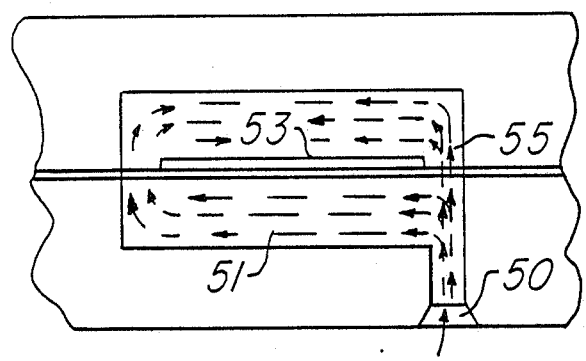
FIG. 10 illustrates a device within a mold cavity showing the flow of the encapsulating material.

FIG. 10 illustrates the compound flow within a cavity during the molding process. The heated compound flows through runner 50 into cavity 51 under the device and lead frame 53, through an opening in the lead frame and between device leads 55 into the upper part of the cavity to complete encapsulation of device.

Figure 11:
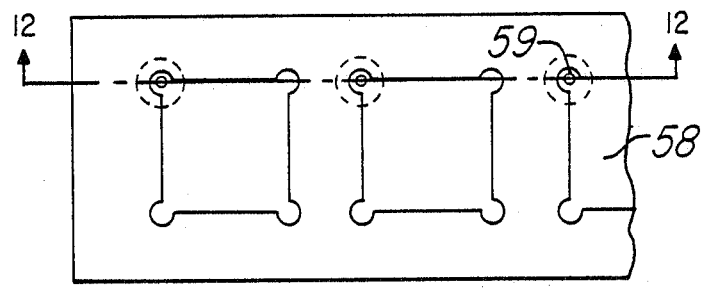
FIG. 11 a partial view of the lower chase.
Figure 12:
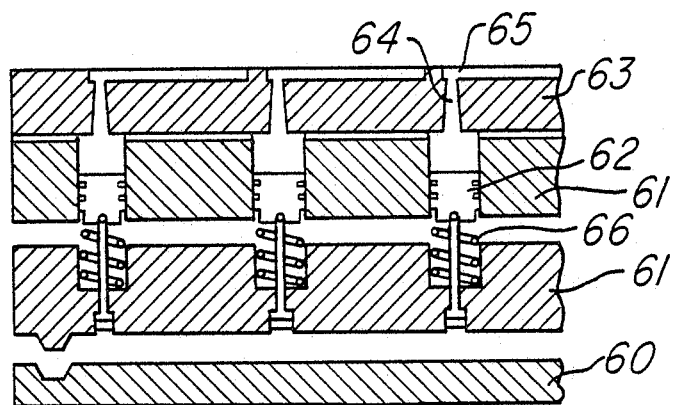
FIG. 12 is a cross section view of the lower mold chase, the charge bar assembly and the mold transfer bar.

FIG. 11 is a partial view of the lower mold chase showing the mold cavity 58 and the gate 59. FIG. 12 is a cross sectional view across section 12—12 of the chase, charge bar assembly, and the mold transfer bar. In operation, the mold transfer bar is moved vertically to contact the charge bar assembly 61. Plunger assembly 62 is spring loaded so that as the mold transfer bar is moved against it the plunger assembly moves plunger tip 62 upward moving the mold compound into runner 64, through gate 65 into the mold cavity 58.

FIGS. 13a and 13b illustrate a replaceable mold gate. It has been observed that the mold cavity does not wear to any great degree, but the gate through which the mold compound wears and affects the flow of mold compound into the cavity. To eliminate problems that arise from gate wear, replaceable gates are used in the lower chase. Such a gate is illustrated in FIGS. 13a and 13b. Gate 70 is essentially tubular with a hollow center tapering from a large opening 71 to small opening 73, end 73 being the actual gate into the mold cavity. The gate end 73 also has opening 72 extending laterally therefrom. The mold compound flows through the gate into the mold cavity such that the lower part of the mold cavity received compound through the lateral part of the gate 72 and the upper mold cavity is fed in part up through the lead frame through gate region 73.

Figure 14:
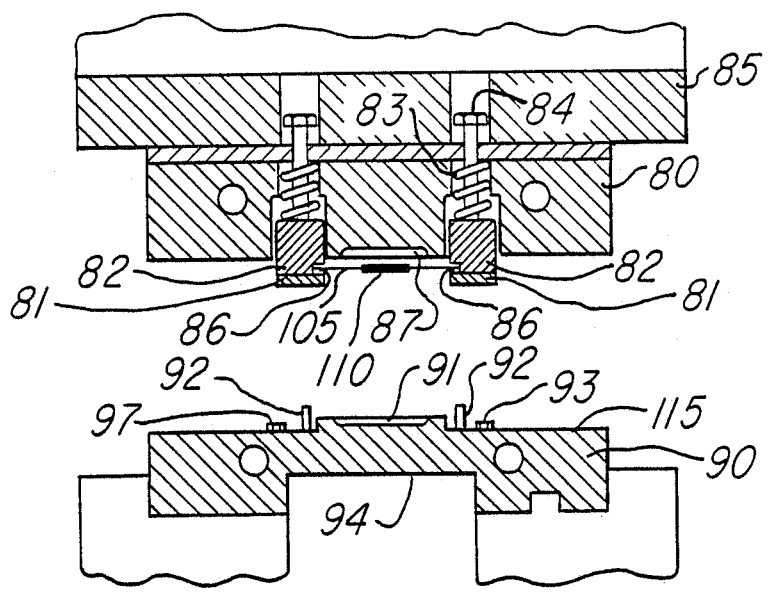
FIG. 14 illustrates the upper mold chase with the lead frame track and the lower mold chase in an open position.

FIG. 14 illustrates the upper and lower chases in the open position, and showing the lead frame track extending down from the upper chase. The lower mold chase 90 is hydraulically activated to inset the lower mold chase 90 with the upper mold chase 80. The lead frame 105 is clamped and indexed into place by the mold chases. Indexing pins 92 in the lower mold chase locates the lead frame precisely in the mold and ejector pins 84, which are internal to the mold chases, eject the molded integrated circuit from the mold.

The lead frame is in the track 86. The track-ejector pin combination is made up of pins 84, springs 83, and the two parts 81 and 82 which form track 86. The side rails 100 (FIG. 15) of the lead frame are in the track openings 86. When the two chases are hydraulically activated, the indexing pins 92 extend through index holes 101 of the lead frame and enter openings 36 (FIG. 6) positioning the lead frame precisely in the mold. As illustrated in FIG. 14, the device 110 is centered in the mold cavities 87 and 91. When the upper and lower chase are brought together, the lower plate engages the track plate 81 moving the track and lead frame upward such that the device 110 is moved into the upper cavity 87, and the lead frame is against the upper chase. Spacer pads 93 engage the lower side of the lead frame so that the edges of the lead frame are properly spaced from the surface 115 of the lower chase.

After the mold compound has been injected into the mold cavities, and the compound has set, the lower chase is lowered, the spring loaded ejector pins and track move the lead frame downward by springs 83 away from the upper chase, thereby removing the molded device from the upper cavity. Thereafter the lead frame is moved out of the mold along the track to permit another lead frame to enter the mold.

Figure 15:
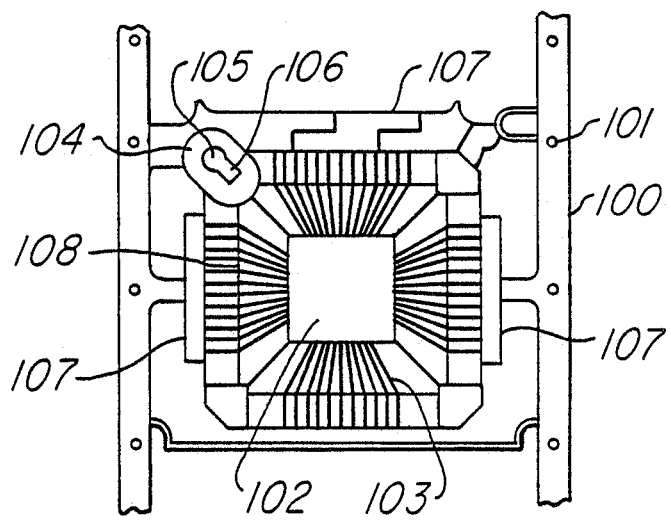
FIG. 15 illustrates a lead frame used when mold compound is injected from under the lower mold chase.

A unique aspect of the invention is illustrated in FIG. 15. FIG. 15 is an example of a lead frame that may be used in practicing the invention. In present day molding practices, the molding compound is usually injected from the side of the mold and the edge of the device, for example across the edge of the lead frame. However, in the lead frame illustrated in FIG. 15, the mold compound is injected from the bottom and up through the lead frame. As illustrated, the molding compound enters through openings 105 and 106 in the lead frame. This opening corresponds with the opening 29 (FIG. 8) in the bottom chase. Also reference is made to FIGS. 13a and 13b. The openings 105 and 106 correspond to gate openings 73 and 72 respectively. It is an advantage in having the molding compound enter from the bottom of the chase to shorten the runner system thereby providing better density control of the molding compound and less deformation of the lead frame.

The lead frame in FIG. 15 also illustrates the device base 102, and support structure 104, 107 and 108 used during the mounting and molding of the semiconductor device. After the device is molded, the support structure extending outside of the encapsulated area is removed leaving each lead pin 103 electrically connected only to the desired area on the semiconductor device.

Figure 16A:
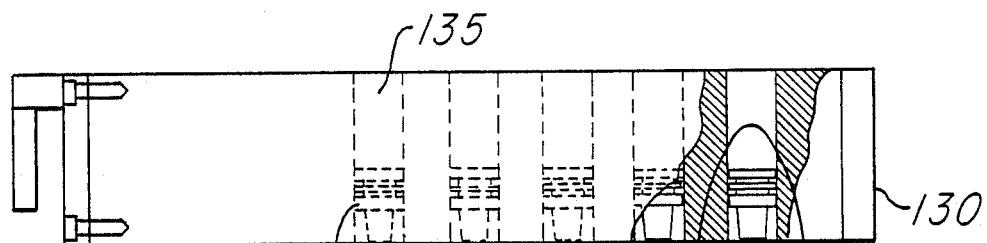
FIGS. 16a and 16b illustrate tapered plunger and tapered plunger tips used to move molding compound from the charge bar to the compound runner and gate.
Figure 16B:
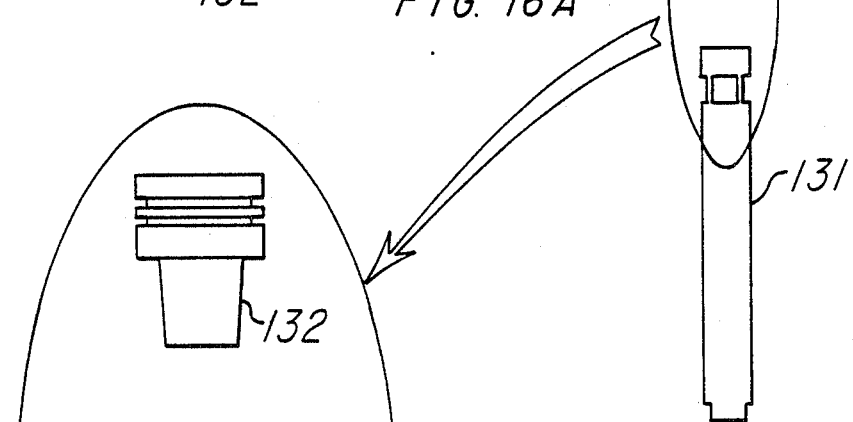

FIGS. 16a and 16b illustrate the tapered plunger and tapered plunger tip used to transfer the molding compound charge from the charge bar into the runners and gates in the lower chase. Charge bar 130 has a plurality of filling cavities 135 into which a measured amount of molding compound is placed by the charge transfer bar. When the charge bar is not in line with the lower chase and the filling chambers are being filled by the charge transfer bar, the plungers 131 are in a lowered position. The plunger tips are in the charge bar and positioned at the bottom of the filling chamber.

After the filling chamber has been loaded with molding compound, the charge bar is moved under the lower chase, and as the molding process begins, the plunger is moved upward hydraulically, engages the tapered end plunger tip and transfers the molding compound from the charge bar to the mold cavity via the short runners 63 (FIG. 12) and gates 65.

It is by this use of tapered plunger tips that the charge bar may be moved off line with the lower chase to be charged, and also permits easy changing of charge bars having different size filling chamber.

What is claimed is:

1. A multiple charge transfer apparatus for receiving a semiconductor lead frame having a semiconductor mounted thereon and gold wire bonded to the lead pins on the lead frame, the molding system including upper and lower mold chases, hydraulic means activated to inset the lower mold chase with the upper mold chase, each chase having at least one mold cavity corresponding to the mold cavity in the other chase, a charge bar, a compound transfer bar, and a mold compound supply chamber, said compound transfer bar movable in line with the compound supply chamber to receive a charge of molding compound and said compound transfer bar movable in line with the compound transfer bar to received mold compound, the compound transfer bar has been movable from the compound transfer bar to a position in-line with the lower chase for supplying mold compound thereto.

2. The molding apparatus according to claim 1, said upper chase includes a lead frame track.

3. The molding apparatus according to claim 2 wherein the lead frame track is spring loaded.

4. The apparatus according to claim 1 wherein the lower chase includes a plurality of mold cavities and compound gates, each mold cavity having its own gate for supplying mold compound to the mold cavity.

5. The apparatus according to claim 4 wherein each compound gate is removable and replaceable.

6. The apparatus according to claim 1 wherein the lower chase includes alignment pins for aligning a lead frame with the mold cavity.

7. The apparatus according to claim 3 wherein a lead frame in the spring loaded lead frame track is positioned against the upper and lower lead frames by upward motion of the lower chase.

8. The apparatus according to claim 1 wherein said charge bar has means for water cooling the bar for minimum heat transfer to the compound prior to molding.

9. The apparatus according to claim 1 including a taper-lock between the transfer bar and the charge bar to facilitate removal from the mold area for the charging operation.

10. A multiple charge transfer molding apparatus for receiving a semiconductor lead frame having a semiconductor mounted thereon and gold wire bonded to the lead pins on the lead frame, the molding system including upper and lower mold chases hydraulically activated to inset the lower mold chase with the upper mold chase, each chase having at least one mold cavity corresponding to the mold cavity in the other chase, each chase being temperature controlled, a compound supply system, a compound transfer bar and a compound charge bar, molding compound being transferred from the compound supply system to the compound transfer bar in a measured amount and then the compound is dispensed to the mold compound charge bar, thereafter the molding compound being injected from the charge bar into the mold cavity.

11. The apparatus according to claim 10 including changeable charge bars to facilitate using charge bars having different charge volumes.

12. The apparatus according to claim 10 including an internal lead frame track as in integral part of the upper mold chase.

13. The apparatus according to claim 12 wherein the lead frame track is spring loaded and positioned during clamping operation of the two chases.

* * * * *